(12) United States Patent
Hiroki et al.

(10) Patent No.: US 9,647,422 B1
(45) Date of Patent: May 9, 2017

(54) LASER DEVICE

(71) Applicant: SHIMADZU CORPORATION, Nakagyo-ku, Kyoto-shi, Kyoto (JP)

(72) Inventors: Tomoyuki Hiroki, Kyoto (JP); Koji Tojo, Kyoto (JP); Kazuma Watanabe, Kyoto (JP); Ichiro Fukushi, Kyoto (JP); Akiyuki Kadoya, Kyoto (JP); Junki Sakamoto, Kyoto (JP); Jiro Saikawa, Kyoto (JP); Naoya Ishigaki, Kyoto (JP); Shingo Uno, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 15/129,061

(22) PCT Filed: Mar. 26, 2014

(86) PCT No.: PCT/JP2014/058478
§ 371 (c)(1),
(2) Date: Sep. 26, 2016

(87) PCT Pub. No.: WO2015/145603
PCT Pub. Date: Oct. 1, 2015

(51) Int. Cl.
*H01S 5/00* (2006.01)
*H01S 5/042* (2006.01)
(Continued)

(52) U.S. Cl.
CPC .......... *H01S 5/042* (2013.01); *B23K 26/0613* (2013.01); *H01S 5/40* (2013.01);
(Continued)

(58) Field of Classification Search
CPC ........ H01S 5/4025; H01S 5/4018; H01S 5/40; H01S 5/42; H01S 5/042
See application file for complete search history.

(56) References Cited

U.S. PATENT DOCUMENTS

| 5,946,334 A * | 8/1999 | Ema | H01S 5/042 372/26 |
| 2008/0273123 A1* | 11/2008 | Morikawa | H04N 9/3105 348/757 |
| 2012/0243562 A1* | 9/2012 | Maron | H01S 5/0428 372/9 |

FOREIGN PATENT DOCUMENTS

| JP | 63-028089 | 2/1988 |
| JP | 03-104331 | 5/1991 |

(Continued)

OTHER PUBLICATIONS

PCT/JP2014/058479, International Search Report mailed Jun. 24, 2014, 2 pages—English, 3 pages—Japanese.

*Primary Examiner* — Kinam Park
(74) *Attorney, Agent, or Firm* — Andrew F. Young, Esq.; Lackenbach Siegel, LLP

(57) ABSTRACT

A laser device has a plurality of semiconductor lasers, a driving device that supplies a driving electric current to the semiconductor laser, a trigger generation circuit that sends a trigger signal to the driving device in order to output the driving electric current, and a wave-combining device that wave-combines laser light emitted from the semiconductor lasers at the combined-wave end, and at least any one of a signal transmitting time, an electric current transmitting time and a light transmitting time is adjusted so as to be the time set respectively for transmitting paths; wherein the signal transmitting time in which the trigger signal transmits over the signal path, the electric current transmitting time in which the laser light transmits over the electric current path, a light transmitting time in which the laser light transmits over the optical path.

7 Claims, 7 Drawing Sheets

(51) Int. Cl.
*H01S 5/40* (2006.01)
*B23K 26/06* (2014.01)
*H01S 5/42* (2006.01)

(52) U.S. Cl.
CPC .......... *H01S 5/4012* (2013.01); *H01S 5/4018* (2013.01); *H01S 5/4025* (2013.01); *H01S 5/42* (2013.01)

(56) References Cited

FOREIGN PATENT DOCUMENTS

| | | |
|---|---|---|
| JP | 09-168884 | 6/1997 |
| JP | 2008-244339 | 10/2008 |
| JP | 2011-061153 | 3/2011 |
| JP | 2012-018122 | 1/2012 |
| JP | 2013-48159 | 3/2013 |

\* cited by examiner

LASER DEVICE

CROSS REFERENCE TO RELATED APPLICATIONS

This application relates to and claims priority from PCT Ser. No.:PCT/JP2014/058478 filed Mar. 26, 2014, the entire contents of which are incorporated herein by reference.

FIGURE SELECTED FOR PUBLICATION

FIG. 1

BACKGROUND OF THE INVENTION

Field of the Invention

The present invention relates to a laser device that combines the laser light emitted from a plurality of laser light elements.

Description of the Related Art

A laser light is being applied to a fine machining such as a welding, a cutting and a marking and so forth. It is desired that a high power output and a low electric power consumption for a laser light source to be applied to such laser machining. A gas laser, a solid laser and a semiconductor laser and so forth has been used as the laser light source, and there among, the semiconductor laser attracts attention from a high efficiency and easy maintenance standpoints. A laser device that combines the laser lights from a plurality of semiconductor lasers is proposed to provide a high-power output (e.g., Patent Document 1.)

RELATED PRIOR ART DOCUMENTS

JP 2013-48159 A1

ASPECTS AND SUMMARY OF THE INVENTION

According to one aspect of the present invention, there is provided a laser device with a plurality of semiconductor lasers, a drive device for supplying a drive current to the semiconductor lasers, a trigger generation circuit for sending to the drive device a trigger signal causing the drive current to be output, and a multiplexing device for causing laser beams emitted from the plurality of semiconductor lasers to be multiplexed at a multiplexing end. In a total time which comprises a signal propagation time for a trigger signal to propagate through a signal path, a current propagation time for a drive current to propagate through a current path, and a beam propagation time for a laser beam to propagate through an optical path whereon the laser beam propagates, at least any of the signal propagation time, the current propagation time, and the light propagation time is adjusted so that the total time yields a timing that has been set for each of a plurality of propagation routes.

Problems to be Solved by the Invention

When a plurality of semiconductor lasers are spatially in-place, a distance between a light path of each semiconductor laser and the combined wave end at which the laser lights of such semiconductor lasers are combined, may be different each other. Therefore, when the semiconductor laser is pulse-driven, it has been difficult to adjust each laser light to reach to the end of the combined wave at a predetermined timing. For example, even if it is attempted that a plurality of semiconductor laser lights reaches to the end of the combined wave at the same timing so as to provide a high-power output, the timings of which the laser lights reach to the end of the combined wave may not coincide due to the difference of the light path distance. As results, the combined wave having a desired power cannot be provided, so that the high-power output of the laser device cannot be obtained.

In addition, when a plurality of semiconductor lasers is connected in series, the distance between each supply source of the driving electric current to drive the semiconductor laser and the semiconductor laser is different respectively, so that each timing at which the laser light is emitted from the semiconductor laser is different each other. Therefore, an adjustment of the timing at which the laser light reaches to the end of the combined laser wave has been difficult.

The purpose of the present invention is to provide a laser device by which the laser light from a plurality of laser elements can reach to the end of the combined laser wave at the predetermined timing.

Means for Solving the Problem

According to the aspect of the present invention, a laser device comprises: a plurality of semiconductor lasers; a driving device that supplies the driving electric current to the plurality of semiconductor lasers; a trigger generation circuit that sends a trigger signal to output the driving electric current; and a wave combining device that combines laser lights emitted respectively from the plurality of semiconductor lasers 10 at the end of the combined wave. And, it is defined that a plurality of transmission paths includes each one of light path of laser lights emitted from any one of the plurality of semiconductor lasers, wherein the plurality of transmission paths comprises a signal path over which the trigger signal that transmits from the trigger generation circuit to the driving device over, an electric current path over which the driving electric current that transmits from the driving device to the semiconductor laser, and an optical path over which a laser light that transmits from the emission outlet to the end of the combined wave; and at least any one of a signal transmitting time, an electric current transmitting time and a light transmitting time is adjusted so as to be the time set respectively for a plurality of transmitting paths; wherein the signal transmitting time in which the trigger signal transmits over the signal path, the electric current transmitting time in which the laser light transmits over the electric current path, a light transmitting time in which the laser light transmits over the optical path.

Effect of the Invention

According to the aspect of the present invention, a laser device by which the laser light from a plurality of laser elements can reach to the end of the combined laser wave at the predetermined timing can be provided.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
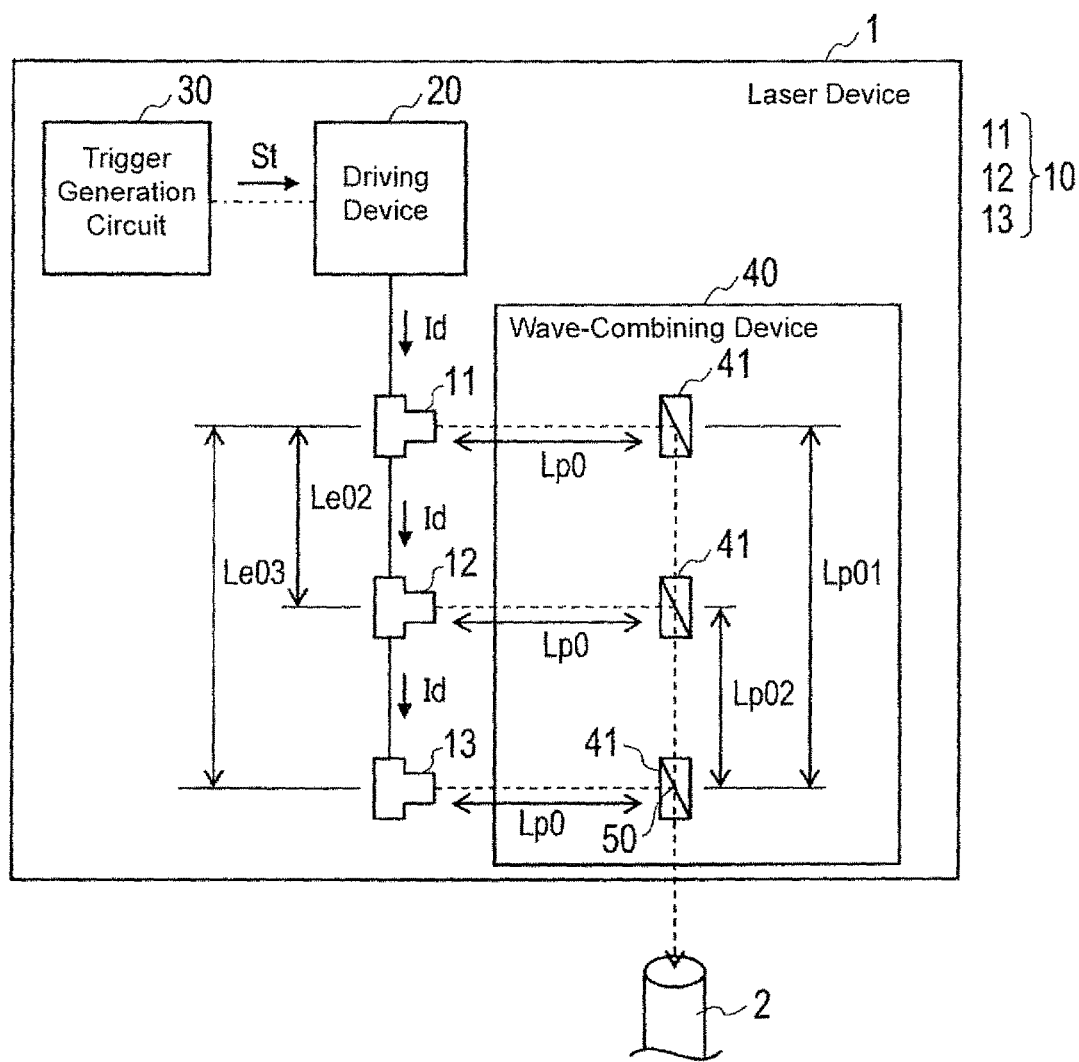
FIG. 1 is a schematic diagram illustrating the structure of a laser device according to the aspect of the Embodiment 1 of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Next, referring to FIGs., the inventor sets forth the Embodiments of the present invention. Referring to FIGs., the same or similar each element has the same or similar sign. However, it must be paid attention that FIGs. are schematic. In addition, hereinafter, the aspect of the Embodiment is an example to specify the technology aspect of the present invention and the structure and the arrangement of the components are not limited to the aspect of the Embodiment. The aspect of the Embodiment of the present invention can be modified in a variety of aspects within the scope of the present invention.

Embodiment 1

Referring to FIG. 1, the laser device 1 of the aspect of the Embodiment of the present invention comprises: a plurality of semiconductor lasers 10, a driving device 20 that provides each plurality of semiconductor lasers 10 with a driving electric current Id, a trigger generation circuit 30 that sends a trigger signal St for outputting the driving electric current Id to the driving device 20, a wave-combining device 40 that combines the laser light emitted respectively from a plurality of semiconductor lasers 10. The wave-combined light is incident in a light receiving device 2. The light receiving device 2 is e.g., an optical fiber and the wave-combining device 40 allows the wave-combined light to be incident in the core element of the optical fiber.

Here, the inventor sets forth the case in which the number of semiconductor lasers 10 included in the laser device 1 is three (semiconductor lasers 11, 12, 13), as an example. Further, needless to say, the number of semiconductor lasers 10 is not limited to three.

Hereinafter, a path over which the trigger signal St transmits from the trigger generation circuit 30 to the driving device 20 is defined as "a signal path Ls." Specifically, the signal path Ls is the path that is from a sending terminal of the trigger signal St of the trigger generation circuit 30 to a receiving terminal receiving the trigger signal St of the driving device 20. For example, when the driving device 20 is a transistor, the receiving terminal is a control electrode of the transistor (e.g., a gate electrode and so forth.) Referring to FIG. 1, the signal path Ls is indicated by a chain line (the same hereinafter.)

In addition, a path over which the driving electric current transmits from the driving device 20 to the semiconductor lasers 10 lasers 10 is "an electric current path Le." Specifically, the electric path Le is the path that is from an output terminal outputting the driving electric current Id of the driving device 20 to an input terminal in which the driving electric current Id of a semiconductor lasers 10 lasers 10 is input. For example, an anode terminal of the semiconductor lasers 10 is an input terminal. Referring to FIG. 1, the electric current path Le is indicated by a solid line (the same hereinafter.)

Further, a path over which the laser light transmits from the emission outlet of the semiconductor lasers 10 to the combined-wave end 50 is "an optical path Lp." Referring to FIG. 1, the optical path Lp is indicated by a broken line (the same hereinafter.) The optical path Lp passes through the wave-combining device 40. The wave-combining device 40 may include, for example, referring to FIG. 1, an optical element 41 that changes a traveling direction of the laser light, and so forth. The optical element may include e.g., a prism, a reflection lens and an optical mirror and so forth.

As set forth above, it is defined that the laser device 1 comprises a plurality of transmitting paths La including the signal path Ls, the electric current path Le and the optical path Lp. One transmitting path La receptively includes one optical path of the laser light emitted from any one of the plurality of the semiconductor lasers 10.

According to the laser device 1, a total time (hereafter a "total transmitting time Ta") of a signal transmitting time Ts while the trigger signal St transmits over the signal path Ls, an electric current transmitting time Te while the driving electric current Id transmits over the electric current path Le, and a light transmitting time Tp while the laser light transmits over the optical path Lp is the time from the time when the trigger signal St is output from the trigger generation circuit 30 to the time when the laser light emitted from the semiconductor lasers 10 reaches to the combined-wave end 50.

Accordingly, the signal transmitting time Ts, the electric current transmitting time Te and the light transmitting time Tp affect the timing at which the laser light emitted from each semiconductor lasers 10 reaches to the combined-wave end 50.

According to the laser device 1, the total transmitting time Ta is set relative to each of the plurality of transmitting paths La so that each laser light emitted from the semiconductor lasers 10 can reach to the combined-wave end 50 at the predetermined timing. Specifically, according to the laser device 1, at least any one of the signal transmitting time Ts, the electric current transmitting time Te and the light transmitting time Tp is adjusted so that the total transmitting time Ta can be the time set respectively for the plurality of transmitting paths La.

Hereafter, the inventor sets forth the laser device 1 that is set so that each laser light emitted from a plurality of semiconductor lasers 10 can reach to the combined-wave end 50 at the same timing. Specifically, at least any one of the signal transmitting time Ts, the electric current transmitting time Te and the light transmitting time Tp is adjusted so that the total transmitting time Ta can be the same with regard to the plurality of transmitting paths La.

Referring to FIG. 1, according to the laser device 1, one driving device 20 is connected to one trigger generation circuit 30. And, the plurality of the semiconductor lasers 10 is connected to the driving device 20 in series. The driving electric current Id output from the driving device 20 is sequentially supplied to the plurality of the semiconductor lasers 10. Specifically, the driving electric current is supplied to the semiconductor lasers 11, 12, 13 connected to the driving device 20 in order from the closer side thereof.

Accordingly, referring to FIG. 1, according to the laser device 1, the signal paths Ls relative to the respective transmitting paths La are commonly used, so that the signal transmitting times Ts are the same.

On the other hand, the electric current path Le is respectively different every transmitting path La. Specifically, with regard to the plurality of the semiconductor lasers 10 connected each other in series, the closer the semiconductor lasers 10 is connected to the driving device 20, the shorter the electric current transmitting time Te is because of the short electric current path Le.

Accordingly, referring to FIG. 1, according to the laser device 1, the closer the transmitting path La, including the light path of the laser light emitted from the semiconductor lasers 10, is connected to the driving device 20, the longer the optical path Lp is set. In such way, the optical path Lp is set so as to cancel the difference between the electric paths Le, so that the total transmitting times Ta can be adjusted to become the same between the respective transmitting paths La. As results, the timing when each laser light emitted from the semiconductor lasers 10 reaches to the combined-wave end 50 coincide each other. Therefore, the laser device 1 can provide a high-power output.

Specifically, the transmitting paths La are set as follows. Referring to FIG. 1; if the lengths Le of the electric current path of the transmitting paths La1, La2, La3, including the respective light paths of the laser light emitted from the semiconductor lasers 11, 12, 13 of the laser device 1 are Le1, Le2, Le3; Le1<Le2<Le3 is obtained. Here, if the transmitting rate of the driving electric current Id is an electric current transmitting rate Ve, the electric current transmitting time Te1 Te2, Te3 relative to the electric current paths Le having lengths Le1, Le2, Le3 are represented as Le1/Ve, Le2/Ve, Le3/Ve.

At this time, Lp1, Lp2, Lp3 that are the lengths of the optical paths Lp of the transmitting paths La1, La2, La3 are set so that the differences between the electric current transmitting times Te, when the driving electric current Id transmits the electric transmitting paths Le having the lengths Le1, Le2, Le3, can be canceled. Specifically, Lp1>Lp2>Lp3 is defined. If the transmitting rate of the laser light relative to the optical paths Lp is the light transmitting rate Vp, the light transmitting time Tp1, Tp2, Tp3 relative to the optical paths Lp having lengths Lp1, Lp2, Lp3 are represented as Lp1/Vp, Lp2/Vp, Lp3/Vp. The following formula (1) can meet to make the total transmitting times Ta of the transmitting paths La1, La2, La3 to be the same: Te1+Tp1=Te2+Tp2=Te3+Tp3 . . . (1) Accordingly, Lp1, Lp2, Lp3 are set to meet the following formula (2):

$$Le1/Ve+Lp1/Vp=Le2/Ve+Lp2/Vp=Le3Ne+Lp3/Vp \quad (2)$$

In addition, referring to FIG. 1, with regard to the laser device 1, each distance Lp0 between the emission outlet of the semiconductor lasers 10 and the optical elements 41 relative to the transmitting paths La is the same. A laser light emitted from the semiconductor lasers 10 is reflected by the optical element 41 and then travels to the light receiving device 2. And, referring to FIG. 1, the laser lights emitted from the semiconductor lasers 11, 12, 13 are wave-combined in the optical element 41 of the transmitting path La3. If a distance from the optical element 41 of the transmitting path La1 to the combined-wave end 50 is the distance Lp01, Lp1=Lp0+Lp01 is obtained. Further, if a distance from the optical element 41 of the transmitting path La2 to the combined-wave end 50 is the distance Lp02, Lp2=Lp0+Lp02 is obtained. With regard to the transmitting path La3, Lp3=Lp0 is obtained.

And, each distance from the optical element 41 to the combined-wave end 50 is adjusted every transmitting path La so that the total transmitting times Ta of the transmitting paths La1, La2, La3 can coincide. Here, when the difference between the length Le1 and the length Let is Le02 and the difference between the length Le1 and the length Le3 is Le03, the inventor sets forth an example in which the total transmitting times Ta coincide. In such case, referring to FIG. 2, an example of the time chart is illustrated, in which the time when the driving electric current Id is supplied to the semiconductor laser 11 is as the reference thereof.

Figure 2:
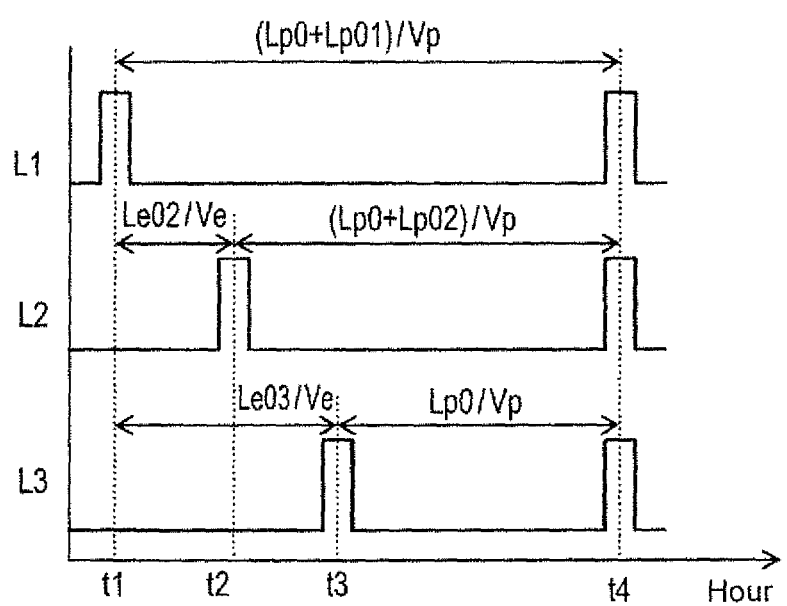
FIG. 2 is a timing chart illustrating the operation of a laser device according to the aspect of the Embodiment 1 of the present invention.

Referring to FIG. 2, the laser light L1 is emitted from the semiconductor laser 11 at the time t1. Then, the driving electric current Id is supplied to the semiconductor laser 12 at the time t2 when the time Le02/Ve has passed from the time t1 so that the laser light L2 can be emitted from the semiconductor laser 12. Further, the driving electric current Id is supplied to the semiconductor laser 13 at the time t3 when the time Le03/Ve has passed from the time t1 so that the laser light L3 can be emitted from the semiconductor laser 13.

On the other hand, the laser light L1 emitted from the semiconductor laser 11 reaches to the combined-wave end 50 at the time t4 when the time (Lp0+Lp01)/Vp has passed from the time U. In addition, the laser light L2 emitted from the semiconductor laser 12 reaches to the combined-wave end 50 at the time t4 when the time (Lp0+Lp02)/Vp has passed from the time t2. Further, the laser light L3 emitted from the semiconductor laser 13 reaches to the combined-wave end 50 at the time t4 when the time Lp0/Vp has passed from the time t3.

Specifically, the differences Lp01, Lp02 between the optical paths are set corresponding to the differences Le02, Le03 between the electric current paths Le so as to meet the following formula (3): Lp0+Lp01)/Vp=Le02/Ve+(Lp0+Lp02)Np=Le03/Ve+Lp0/Vp . . . (3)

According to the above description, each distance from the optical element 41 to the combined-wave end 50 is adjusted every transmitting path La. However, needless to say, a distance from the emission outlet of the semiconductor lasers 10 to the optical element 41 can be adjusted, or both distance from the emission outlet of the semiconductor lasers 10 to the optical element 41 and distance from the optical element 41 to the combined-wave end 50 can be adjusted.

As set forth above, the total transmitting times of all transmitting paths La are set so as to be equal so that each of timing when each laser light emitted from the semiconductor lasers 11, 12, 13 reaches to the combined-wave end 50 can coincide. As results, the laser device 1 can provide a high-power output.

As set forth above, the example, in which the difference between the lengths of the electric current paths Le is canceled by the difference between the lengths of the optical path Lp, is described. However, needless to say, when the lengths of the optical path Lp are different, the length of the electric current paths can be adjusted.

Referring to FIG. 1, according to the laser device 1, the semiconductor lasers 10 are directly connected in series to the driving device 20 so that the electric power consumption can be suppressed.

Figure 3:
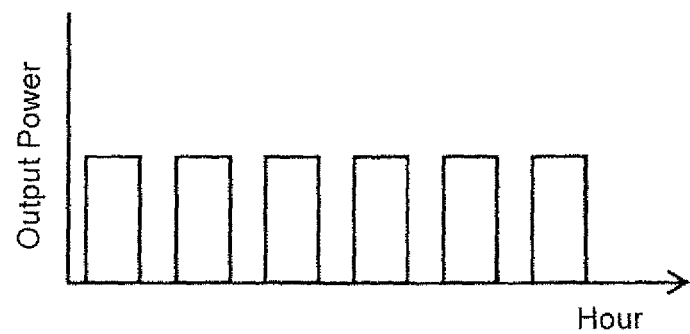
FIG. 3 is a schematic diagram illustrating the power output example at the end of the combined wave of a laser device according to the aspect of the Embodiment 1 of the present invention.

Meantime, as set forth above, the inventor set forth the case when each total transmitting time Ta is the same with regard to the respective transmitting paths La. Accordingly, the timing when each laser light emitted from the semiconductor lasers 10 reaches to the combined-wave end 50 coincide each other, so that the laser device 1 can be provided with a high-power output. However, the length of the transmitting paths La can be changed every semiconductor lasers 10, so that the timing when each laser light of the semiconductor lasers 10 reaches to the combined-wave end 50 can be set to be different. Specifically, the total transmitting time is set with a predetermined deviation every semiconductor lasers 10, Therefore, for example, referring to FIG. 3, the laser light of the semiconductor lasers 10 can be incident in the light receiving device 2 at the constant cycle shorter than the cycle of the trigger signal St sent by the trigger generation circuit 30. Accordingly, for example, a laser device 1 can be applied for laser machining, which does not requires a high-power output obtained by wave-combining the laser lights from a plurality of semiconductor lasers 10, but needs to irradiate a laser light in a short cycle.

Alternative Embodiment

Figure 4:
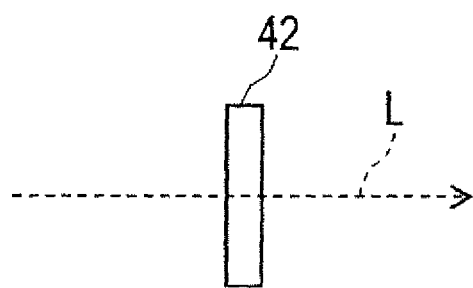
FIG. 4 is a schematic diagram illustrating the method of adjusting the light transmitting time of a laser device according to the aspect of the Embodiment 1 of the present invention.

According to the above description, the inventor set forth the case in which the physical length of the optical path Lp is set and the light transmitting time Tp is adjusted, but the light transmitting time Tp can be adjusted by the other method. For example, referring to FIG. 4, an optical element, e.g., a glass plate 42, that decreases the traveling velocity of the laser light L, is in-place on the optical path Lp on which the laser light L travels. In such way, the light transmitting velocity Vp can be changed every optical path Lp and a difference between the light transmitting times Tp can be set every transmitting path La.

Or other than an adjustment of the length of the electric current Le, the conductor wire made of a different material or having a different shape (pattern) can be adopted to the electric current path Le so that the electric transmitting velocity Ve of the driving electric current Id can be different every transmitting path La. Specifically, the transmitting paths La and respective electric current paths Le are made of the conductor wire each other providing with a different electric current transmitting velocity Ve of the driving electric current Id so that the difference between electric current transmitting time Te every transmitting path La can be set.

For example, an electric permittivity of the conductor wire is set to be that the longer the length of the transmitting path La of the electric current path Le is, the shorter the electric current transmitting time Te is set. In such way, the difference between the signal transmitting time Is over the transmitting path La and the total of the light transmitting time Tp and the difference between the signal transmitting time Is over the transmitting path La and the electric current transmitting time Te can be canceled to some extent. For example, the closer the driving device 20 is to the trigger generation circuit 30, the slower electric current transmitting velocity Ve the conductor wire having is applied to the electric current path Le.

In such way, when a conductor wire made of materials having a different permittivity or an conductor wire having a different configuration relative to a film thickness or a width is used, the electric current transmitting time Te can be adjusted as for the respective plurality of the transmitting paths La. However, the difference of the transmitting velocity based on the material of the conductor wire or the configuration thereof is a little. Therefore, it is preferred that the differences between lengths of the signal paths Ls are approximately conformed by the differences between lengths of the optical paths Lp and the effect of the differences based on the differences of materials of the conductor wire or configurations thereof is applied to a fine adjustment.

Embodiment 2

Figure 5:
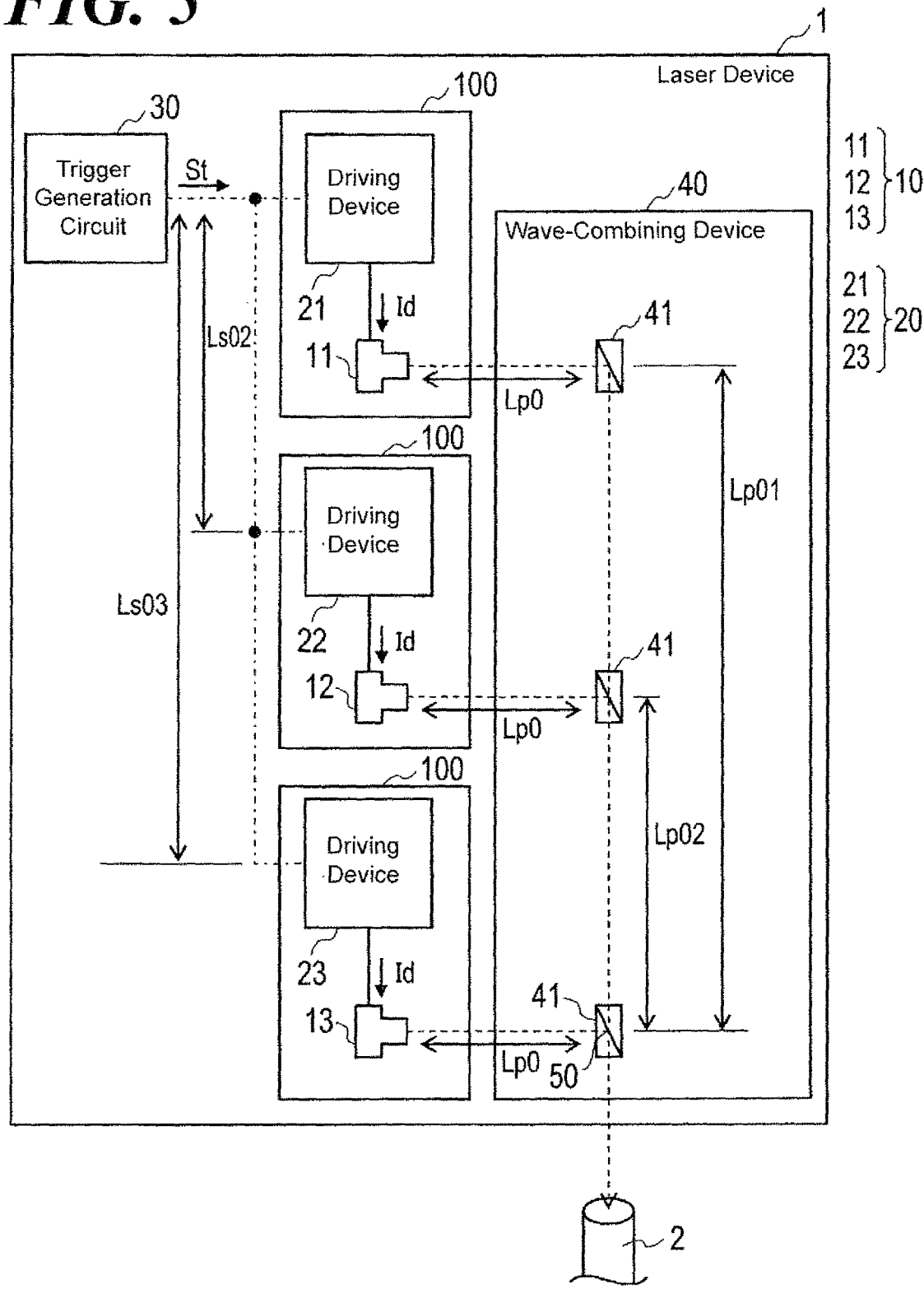
FIG. 5 is a schematic diagram illustrating the structure of a laser device according to the aspect of the Embodiment 2 of the present invention.

Referring to FIG. 5, according to the laser device 1 of the Embodiment 2 of the present invention, a plurality of driving devices 20 is connected to one trigger generation circuit 30 and semiconductor lasers 10 are connected to the respective driving devices 20. Specifically, a timing when a plurality of laser units 100 including each one of the driving devices 20 and the semiconductor lasers 10 emits laser light is configured to be controlled by a common trigger generation circuit 30. Here, relative to each laser unit 100, the length of the electric current paths Le is equal each other and the electric current transmitting times Te thereof is equal each other. Others are the same as the laser device 1 referred to FIG. 1.

Referring to FIG. 5, according to the laser device 1, signal paths Ls are respectively different every transmitting path La. Specifically, the closer the laser unit 100 is in-place to the trigger generation circuit 30, the shorter the signal path Ls is and the shorter the signal transmitting time Ts is, accordingly. Specifically, the trigger signal St is received in order of the driving devices 21, 22, 23. Specifically, the driving electric current Id is supplied in order of the semiconductor lasers 11, 12, 13.

Accordingly, referring to FIG. 5., according to the laser device 1, the closer the transmitting path La includes the light path of the laser light emitted from the semiconductor lasers 100 that are in-place to the driving device 30, the longer optical path Lp is set to cancel the difference of the signal paths Ls. In such way, the total transmitting times Ta is set to be equal each other with regard to the respective transmitting paths La. As results, the timing when each laser light emitted from the semiconductor lasers 10 reaches to the combined-wave end 50 coincides each other. Therefore, the laser device 1 can provide a high-power output.

Specifically, as follows, the transmitting paths La are set. Referring to FIG. 5; if the lengths Le of the signal path Ls of the transmitting paths La1, La2, La3, including the respective semiconductor lasers 11, 12, 13 of the laser device 1 are Ls1, Ls2, Le3; Le1<Le2<Le3 is obtained. Here, if the transmitting velocity of the trigger signal St is a signal transmitting velocity Vs, the signal transmitting times Ts1, Ts2, Ts3 relative to the signal path Ls having the lengths Ls1, Ls2, Ls3 are respectively equal to Ls1/Vs, Ls2/Vs, Ls3/Vs.

At this time, Lp1, Lp2, Lp3, which are the lengths of the optical paths Lp of the transmitting paths La1, La2, La3, are set so that the differences between the trigger signal transmitting times Ts, in which the trigger signal St transmits the signal paths Ls having the lengths Ls1, Ls2, Ls3, can be canceled. Specifically, Lp1>Lp2>Lp3 is defined. The electric current transmitting time Tp1, Tp2, Tp3 relative to the optical paths Lp having lengths Lp1 Lp2, Lp3 are represented by Lp1/Vp, Lp2/Vp, Lp3/Vp. Therefore, the following formula (4) can meet to make the total transmitting times Ta of the transmitting paths La1, La2, La3 the same: Ts1+Tp1=Ts2+Tp2=Ts3+Tp3 . . . (4) Accordingly, Lp1, Lp2, Lp3 are set to meet the following formula (5): Ls1/Vs+Lp1/Vp=Ls2/Vs+Lp2/Vp=Ls3/Vs+Lp3/Vp . . . (5)

In addition, with regard to the laser device 1 referring to FIG. 5, the distances Lp0 between the emission outlet of the semiconductor lasers 10 and the optical element 41 relative to the transmitting paths La are the same, and Lp1=Lp0+p01, Lp2=Lp0+Lp02, Lp3 Lp0 are provided.

And, each distance from the optical element 41 to the combined-wave end 50 is adjusted every transmitting path La, so that the total transmitting times Ta of the transmitting paths La1–La3 can coincide. Here, the inventor sets forth how the total transmitting times Ta can coincide, as an example, when the difference between the length Ls1 and the length Ls2 is Ls02 and the difference between the length Ls1 and the length Ls3 is Ls03. In such case, referring to FIG. 6, an example of the timing chart is illustrated as the reference time t0 that is the time when the trigger signal St is sent to the driving device 21 having the length Ls1 of the signal path Ls.

Figure 6:
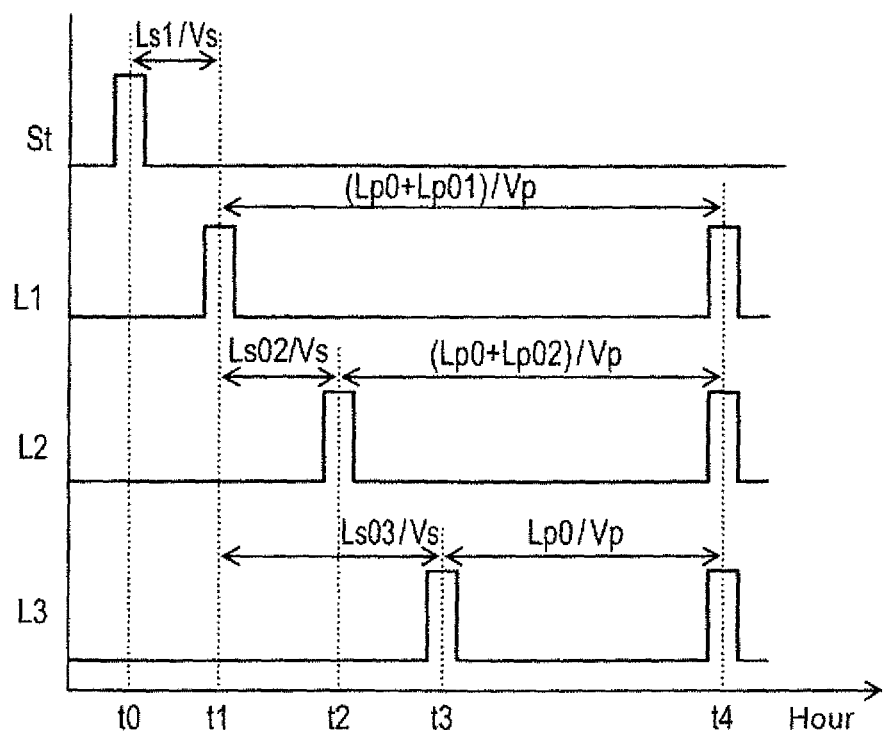
FIG. 6 is a timing chart illustrating the operation of a laser device according to the aspect of the Embodiment 2 of the present invention.

Referring to FIG. 6, the laser light L1 is emitted from the semiconductor laser 11 at the time t1 after the time Ls0/Vs has passed from the time t0. Then after, the laser light L2 is emitted from the semiconductor laser 12 at the time t2 after the time Ls02/Vs has passed from the time t1. Further, the laser light L3 is emitted from the semiconductor laser 13 at the time t3 after the time Ls03/Vs has passed from the time t1.

On the other hand, the laser light L1 emitted from the semiconductor laser 11 reaches to the combined-wave end 50 at the time t4 when the time (Lp0+Lp01)/Vp has passed from the time t1. In addition, the laser light L2 emitted from the semiconductor laser 12 reaches to the combined-wave end 50 at the time t4 when the time (Lp0+Lp02)/Vp has passed from the time t2. Further, the laser light L3 emitted from the semiconductor laser 13 reaches to the combined-wave end 50 at the time t4 when the time Lp0/Vp has passed from the time t3.

Specifically, the differences Lp01, Lp02 of the optical paths are set corresponding to the differences Ls02, Ls03 of the signal paths Ls so as to meet the following formula (6): Lp0+Lp01)/Vp=Ls02/Vs+(Lp0+Lp02)/Vp=Ls03/Vs+Lp0/Vp . . . (6)

According to the above description, the inventor sets forth the example in which each distance from the optical element 41 to the combined-wave end 50 is adjusted every transmitting path La. However, needless to say, a distance from the emission outlet of the semiconductor lasers 10 to the optical element 41 can be adjusted, or both distance from the emission outlet of the semiconductor lasers 10 to the optical element 41 and distance from the optical element 41 to the combined-wave end 50 can be adjusted.

As set forth above, the total transmitting times Ta of all transmitting paths La are set to become equal so that each timing when each laser light emitted from the semiconductor lasers 11, 12, 13 reaches to the combined-wave end 50 can coincide. As results, the laser device 1 can provide a high-power output. Further, as well as the Embodiment 1, the respective laser lights output from the semiconductor lasers 10 can reach to the combined-wave end 50 at the different timing.

Referring to FIG. 5, according to the laser device 1, a plurality of the semiconductor laser units 100 are connected in parallel to the trigger generation circuit 30 so that the plurality of the semiconductor lasers 10 can be controlled at a high velocity. Further, as set forth relative to the alternative Embodiment of the Embodiment 1, the light transmitting velocity Vp is changed every optical path Lp so that the light transmitting time Tp can be adjusted every transmitting path La.

Further, the example is described, in which the difference of the length between the signal paths Ls is canceled by the difference between the lengths of the optical paths Lp. However, needless to say, when the lengths of the optical path Lp are different, the length between the signal paths Ls can be adjusted.

Alternative Embodiment

The electric current paths Le between the driving device 20 and the semiconductor lasers 10 can be set every laser unit 100 so as to cancel the difference between the signal paths Ls. Specifically, the longer signal paths Ls the laser unit 100 has, the shorter path the electric current paths Le should be set to be. In such way, the difference between the signal transmitting times Ts can also be canceled by the electric current transmitting time Te. Or needless to say, the difference between the signal transmitting times Ts can be canceled by both electric current transmitting time Te and light transmitting time Tp.

For example, Le02 is the difference between the length of the electric current paths Le between the driving device 21 and the semiconductor laser 11 and the length of the electric current path Le between the driving device 22 and the semiconductor laser 12; and Le03 is the difference the electric current paths Le between the length of the driving device 21 and the semiconductor laser 11 and the length of the electric current path Le between the driving device 23 and the semiconductor laser 13. At this time, the signal paths Ls, the electric current paths Le and the optical paths Lp are set every transmitting path La so as to meet the below formula (7). (Lp0+Lp01)/Vp=Ls02/Vs+Le02/Ve+(Lp0+Lp02)/Vp=Ls03/Vs+Le03/Ve+Lp0/Vp . . . (7)

If the formula (7) is met, the total transmitting times Ta can be equal each other with regard to all transmitting paths La. As results, the timing when each laser light emitted from the semiconductor laser 11, 12, 13 reaches to the combined-wave end 50 can coincide each other.

Other aspects are the same as the Embodiment 1 and the duplicate description is skipped.

Other Embodiments

As set forth above, the present invention is described according to the aspect of the Embodiments, but it should not be understood that any parts, description and FIGs, of the present disclosure may limit the present invention. According to the present disclosure, a person skilled in the art can realize that a variety of the alternative Embodiment and applicable technology are clear.

Figure 7:
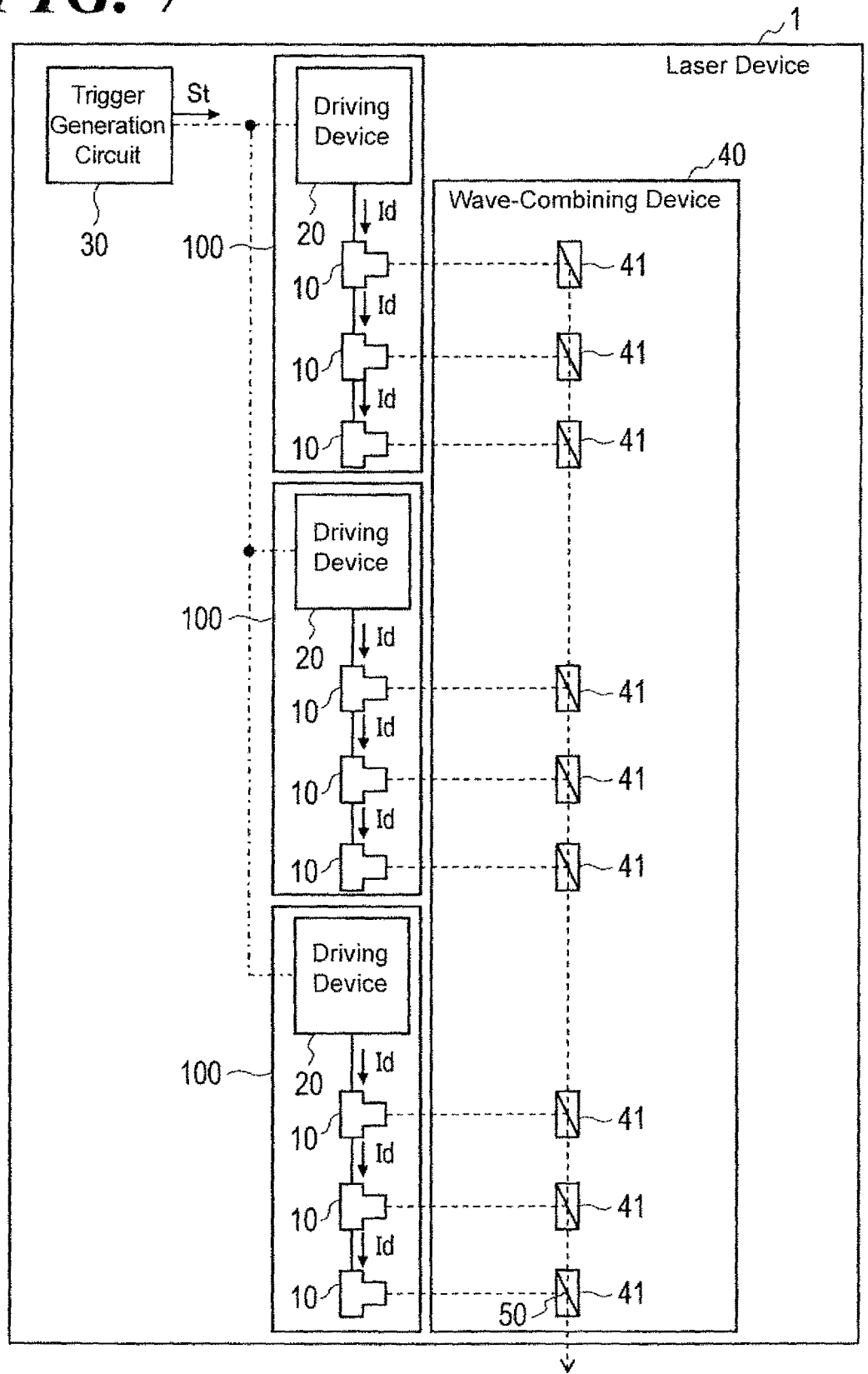
FIG. 7 is a schematic diagram illustrating the structure of a laser machining device according to the aspect of other Embodiment of the present invention.

For example, referring to FIG. 7, the present invention can be applied to a laser device 1 having a plurality of laser units 100 that comprises a driving device 20, in which a plurality of semiconductor lasers 10 are respectively connected in series. As described above, according to the laser device 1, in which trigger signal St sent from the same trigger generation circuit 30 to a plurality of laser units 100, at least any one of the signal transmitting time Ts, the electric current transmitting time Te and the light transmitting time Tp is adjusted so that the total transmitting time Ta can be the time set respectively for the plurality of transmitting paths La.

Specifically, the optical paths Lp is adjusted to cancel the difference between electric current paths Le inside the laser unit 100, or the electric current path Le is adjusted to cancel the difference between optical paths Lp between the laser units 100. In addition, either optical paths Lp or electric current paths Le is adjusted or both are adjusted to cancel the difference between the signal paths Ls between the laser units 100.

In such way, needless to say, the present invention may include a variety of aspects of the Embodiments and so forth, even not described here. Accordingly, the scope of the technology of the present invention can be only specified by the invention specific matters related to the reasonable scope of the above description.

INDUSTRIAL APPLICABILITY

The present invention relates to a laser device that wave-combines the laser light emitted from a plurality of semiconductor lasers.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A laser device comprising:
   a plurality of semiconductor lasers;
   a driving device that supplies the driving electric current to said plurality of semiconductor lasers;
   a trigger generation circuit that sends a trigger signal for outputting said driving electric current to said driving device;
   a wave combining device that combines laser lights emitted respectively from said plurality of semiconductor lasers at the combined wave end; and
   a plurality of transmitting paths, further comprising:
      a signal path over which said trigger signal transmits from said trigger generation circuit to said driving device; an electric current path over which said driving electric current transmits from said driving device to said semiconductor laser, and an optical path over which said laser light transmits from said emission outlet to said combined-wave end; wherein said plurality of transmitting paths includes respectively one of light paths of said laser lights emitted from any one of said plurality of semiconductor lasers; and
   wherein at least one of said signal transmitting time, said electric current transmitting time and said light transmitting time is adjusted so that a total time of a signal transmitting time while said trigger signal transmits over said signal path, an electric current transmitting time while said driving electric current transmits over said electric current path, and a light transmitting time while said laser light transmits over said optical path can be the time set for respective plurality of said transmitting paths.

2. The laser device according to claim 1, wherein:
   at least one of said signal transmitting time, said electric current transmitting time and said light transmitting time is adjusted so that said total time is the same in a plurality of said transmitting paths.

3. The laser device according to claim 1, wherein
   at least one of said signal transmitting time, said electric current transmitting time and said light transmitting time is adjusted so that said respective laser lights output from said plurality of semiconductor lasers reach to said combined-wave end at a different timing each other.

4. The laser device according to claim 1, wherein:
   said plurality of semiconductor lasers are connected in series so that said driving electric current is supplied sequentially to said plurality of semiconductor lasers, and said optical path is set longer if said transmitting path including an optical path of the laser light emitted from said semiconductor laser is in first supplied with said driving electric current because said electric current path is short.

5. The laser device according to claim 1, further comprising:
   said plurality of driving devices receiving said trigger signal from said same trigger generation circuit, and
   said optical path is set long if said transmitting path including said driving device receives in first said trigger signal because said signal path is short.

6. The laser device according to claim 1, wherein:
   a difference between said electric current transmitting times every said transmitting path is set by using a conductor wire having each other's different transmitting velocity of said driving electric current for said electric current path of said respective transmitting paths.

7. The laser device according to claim 1, wherein:
   a difference between said light transmitting times every said transmitting path is set by arranging an optical element decreasing a traveling velocity of said laser light in said optical path.

* * * * *